United States Patent
Jung et al.

(10) Patent No.: US 8,810,114 B2
(45) Date of Patent: Aug. 19, 2014

(54) OPTICAL UNIT AND ORGANIC LIGHT EMITTING DIODE DISPLAY HAVING THE SAME

(75) Inventors: Woo-Suk Jung, Yongin (KR); Soon-Ryong Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 247 days.

(21) Appl. No.: 13/137,978

(22) Filed: Sep. 22, 2011

(65) Prior Publication Data

US 2012/0098422 A1    Apr. 26, 2012

(30) Foreign Application Priority Data

Oct. 25, 2010   (KR) .................. 10-2010-0104039

(51) Int. Cl.
   *H01J 5/16*      (2006.01)
(52) U.S. Cl.
   USPC ........................................ 313/112; 313/504

(58) Field of Classification Search
   USPC ................................................. 313/112, 504
   See application file for complete search history.

(56) References Cited

U.S. PATENT DOCUMENTS

| 2004/0100708 A1* | 5/2004 | Noda et al. ................... 359/883 |
| 2007/0120475 A1* | 5/2007 | Ishitani et al. ............... 313/506 |
| 2010/0156282 A1* | 6/2010 | Park et al. .................... 313/504 |

FOREIGN PATENT DOCUMENTS

| JP | 2003-332068 A | 11/2003 |
| JP | 2008-165043 A | 7/2008 |
| KR | 10 2009 0026067 A | 3/2009 |
| KR | 10 2009 0026125 A | 3/2009 |
| KR | 10-0897742 B1 | 5/2009 |

* cited by examiner

*Primary Examiner* — Andrew Coughlin
(74) *Attorney, Agent, or Firm* — Lee & Morse, P.C.

(57) ABSTRACT

An optical unit on a light emitting unit includes a first polarizing plate on the light emitting unit, a second polarizing plate on the first polarizing plate, the second polarizing plate having a higher polarization degree than the first polarizing plate, and a plurality of phase shift plates between the first polarizing plate and the second polarizing plate.

11 Claims, 12 Drawing Sheets

OPTICAL UNIT AND ORGANIC LIGHT EMITTING DIODE DISPLAY HAVING THE SAME

BACKGROUND

1. Field

Embodiments relate to an optical unit. More particularly, embodiments relate to an optical unit for improving light characteristics, and an organic light emitting diode (OLED) display having the same.

2. Description of the Related Art

A display device displays an image. An organic light emitting diode (OLED) display has a self light emitting characteristic. Unlike a liquid crystal display (LCD), an OLED display does not require a light source. Accordingly, the thickness and weight can be reduced. The organic light emitting diode (OLED) display has high fidelity characteristics, such as low power consumption, high luminance, and fast reaction speed.

The disclosed information in the Background is only for enhancing an understanding of the background of the described technology. Therefore, it may contain information that does not form the prior art already known to a person of ordinary skill in the art in this country.

SUMMARY

Present embodiments may be directed to an optical unit and an organic light emitting diode (OLED) display.

An exemplary embodiment provides an optical unit on a light emitting unit, including a first polarizing plate on the light emitting unit, a second polarizing plate on the first polarizing plate, the second polarizing plate having a higher polarization degree than the first polarizing plate, and a plurality of phase shift plates between the first polarizing plate and the second polarizing plate.

The first polarizing plate may have a higher transmittance than that of the second polarizing plate.

The first polarizing plate may include a matrix, an iodine, and a dye.

A weight ratio of the iodine and the dye may be in a range of about 1:1 to about 1:2.

An intersection angle between a polarization axis of the first polarizing plate and a polarization axis of the second polarizing plate may be about 45 degrees.

The plurality of phase shift plates may include: a first phase shift plate between the first polarizing plate and the second polarizing plate, wherein the first phase shift plate is a ½ wavelength plate; a second phase shift plate between the first polarizing plate and the first phase shift plate, wherein the second phase shift plate is a ¼ wavelength plate; and a third phase shift plate between the first polarizing plate and the second phase shift plate, wherein the third phase shift plate is a ¼ wavelength plate.

An intersection angle between a polarization axis of the second polarizing plate and an optical axis of the first phase shift plate may be in a range of about 17.5 degrees to about 27.5 degrees, and an intersection angle between a polarization axis of the first polarizing plate and an optical axis of the first phase shift plate may be in a range of about 17.5 degrees and to about 27.5 degrees.

An intersection angle between a polarization axis of the second polarizing plate and an optical axis of the second phase shift plate may be in a range of about 40 degrees to about 50 degrees, and an intersection angle between a polarization axis of the first polarizing plate and an optical axis of the second phase shift plate may be in a range of about 0 degrees to about 5 degrees.

An intersection angle between a polarization axis of the second polarizing plate and an optical axis of the third phase shift plate may be in a range of about 85 degrees to about 90 degrees, and an intersection angle between a polarization axis of the first polarizing plate and an optical axis of the third phase shift plate may be in a range of about 40 degrees to about 50 degrees.

An intersection angle between an optical axis of the second phase shift plate and an optical axis of the third phase shift plate may be about 45 degrees.

The plurality of phase shift plates may include: a fourth phase shift plate between the first polarizing plate and the second polarizing plate, wherein the fourth phase shift plate is a ½ wavelength plate; and a fifth phase shift plate between the first polarizing plate and the fifth phase shift plate, wherein the fifth phase shift plate is a ¼ wavelength plate.

An intersection angle between a polarization axis of the second polarizing plate and an optical axis of the fourth phase shift plate may be in a range of about 10 degrees to about 20 degrees, and an intersection angle between a polarization axis of the first polarizing plate and an optical axis of the fourth phase shift plate may be in a range of about 25 degrees to about 35 degrees.

An intersection angle between a polarization axis of the second polarizing plate and an optical axis of the fifth phase shift plate may be in a range of about 70 degrees to about 80 degrees, and an intersection angle between a polarization axis of the first polarizing plate and an optical axis of the fifth phase shift plate may be in a range of about 25 degrees to about 35 degrees.

The optical unit may further include a sixth phase shift plate between the light emitting unit and the first polarizing plate.

An intersection angle between an optical axis of the sixth phase shift plate and a polarization axis of the first polarizing plate may be in a range of about 40 degrees to about 50 degrees.

Another exemplary embodiment provides an organic light emitting diode (OLED) display including an organic light emitting element for emitting light, wherein the organic light emitting element includes a first electrode, a second electrode on the first electrode, and an organic emission layer between the first electrode and the second electrode, and the above described light emitting unit on the light emitting element.

DETAILED DESCRIPTION

Figure 1:
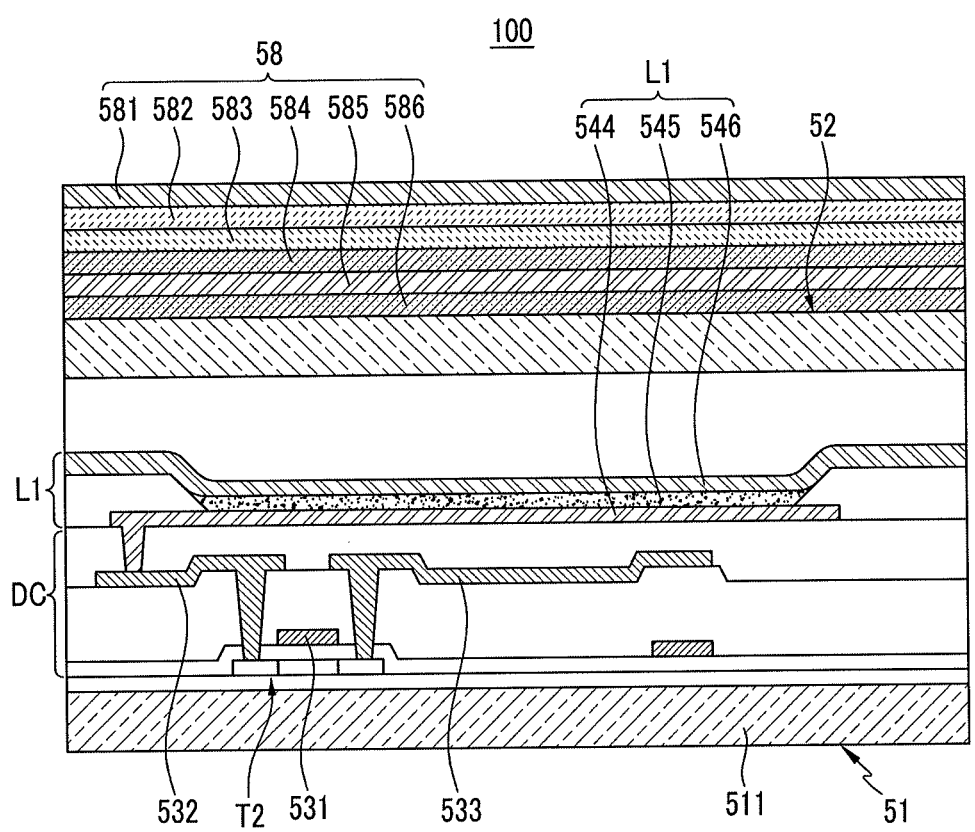
FIG. 1 is a cross-sectional view illustrating an organic light emitting diode (OLED) display according to a first exemplary embodiment.

Korean Patent Application No. 10-2010-0104039, filed on Oct. 25, 2010, in the Korean Intellectual Property Office, and entitled: "Optical Unit and Organic Light Emitting Diode Display having the Same," is incorporated by reference herein in its entirety.

The inventive concept will now be described more fully hereinafter with reference to the accompanying drawings, in which exemplary embodiments of the inventive concept are illustrated. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Accordingly, the drawings and description are to be regarded as illustrative in nature and not restrictive. Throughout the specification, like reference numerals denote like elements. The first exemplary embodiment will be representatively described using like reference numerals for like constituent elements having the same structure in various exemplary embodiments. Other exemplary embodiments will be described based on differences from the first exemplary embodiment.

In drawings, the size and thickness of each element are approximately shown for better understanding and easy of description. Therefore, the inventive concept is not limited to the drawings. In the drawings, the thickness of layers, films, panels, regions, etc., are exaggerated for clarity. In the drawings, the thicknesses of layers or regions are exaggerated for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In the specification, it will be understood that when an element is referred to as being on another element, it can be above another element or below another element. It does not mean that the element must be above another element in a gravity direction.

Hereinafter, an organic light emitting diode (OLED) display according to a first exemplary embodiment will be described with reference to FIG. 1 to FIG. 8.

FIG. 1 is a cross-sectional view illustrating an organic light emitting diode (OLED) display according to a first exemplary embodiment.

As shown in FIG. 1, the OLED display 100, according to the first exemplary embodiment, includes a first substrate 51, a second substrate 52 adhered to the first substrate 51, and an optical unit 58.

The first substrate 51 includes a substrate member 511, a driving circuit (DC) formed on the substrate member 511, and an organic light emitting element L1. The organic light emitting element L1 is formed on the driving circuit (DC) as a light emitting unit.

Figure 2:
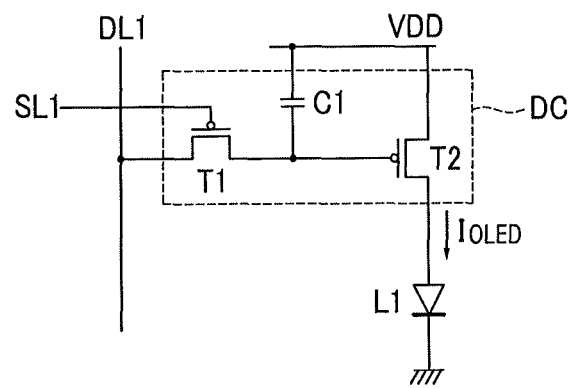
FIG. 2 is a layout view illustrating a driving circuit and an organic light emitting element of an organic light emitting diode display according to the first exemplary embodiment.

FIG. 2 is a layout view illustrating a driving circuit and an organic light emitting element of an organic light emitting diode display according to the first exemplary embodiment.

As shown in FIG. 2, the driving circuit (DC) generally has a structure of FIG. 2. As shown in FIG. 2, the driving circuit (DC) includes at least two thin film transistors T1 and T2 and at least one capacitor C1. The thin film transistor includes a switching transistor T1 and a driving transistor T2.

The OLED display, according to the first exemplary embodiment, has a 2Tr-1Cap structure. However, an OLED display according to another exemplary embodiment, may have various structures, including at least three film transistors, at least two capacitors, and additional wires. Additional thin film transistors and capacitors may be elements of a compensating circuit.

A switching transistor T1 is connected to a scan line SL1 and a data line DL1. The scan line SL1 transmits a data voltage input from the data line DL1 to the driving transistor T2 according to a switching voltage input to the scan line SL1. A capacitor C1 is connected to the switching transistor T1 and a power supply line VDD. The capacitor C1 stores a voltage difference between a voltage transmitted from the switching transistor T1 and a voltage supplied from the power supply line VDD.

The driving transistor T2 is connected to the power supply line VDD and the capacitor C1. The driving transistor T2 supplies an output current ($I_{OLED}$) to the organic light emitting element L1 in proportion to a square of a voltage difference of a voltage stored in the capacitor C1 and a threshold voltage. The organic light emitting element L1 emits light by the output current ($I_{OLED}$).

Referring to FIG. 1, the driving transistor T2 includes a source electrode 533, a drain electrode 532, and a gate electrode 531.

The organic light emitting element L1 displays an image by emitting light. The organic light emitting element L1 includes a first electrode 544, an organic emission layer 545 formed on the first electrode 544, and a second electrode 546 formed on the organic emission layer 545. The second electrode 546 is disposed on the first electrode 544. The organic emission layer 545 is disposed between the first electrode 544 and the second electrode 546. The first electrode 544 is an anode and the second electrode 546 is a cathode. However, the first exemplary embodiment is not limited thereto. According to a driving method, the first electrode 544 may be a cathode, and the second electrode 546 may be an anode. The first electrode 544 of the organic light emitting element L1 is connected to a drain electrode 532 of the driving transistor T2. At least one of the first electrode 544 and the second electrode 546 is formed to be translucent or reflective to reflect light.

The organic light emitting diode (OLED) display 100, according to the first exemplary embodiment, displays images by emitting light at the organic light emitting element L1 in a direction from the organic emission layer 545 to the second electrode 546. The organic light emitting diode (OLED) display 100 is a top emission type.

The optical unit 58 improves visibility of the organic light emitting diode (OLED) display 100 by suppressing the reflection of external light caused by the organic light emitting element L1. The optical unit 58 minimizes the loss of light emitted from the organic light emitting element L1. The optical unit 58 includes a first polarizing plate 585, a second polarizing plate 581, and a plurality of phase shift plates 582, 583, and 584.

The first polarizing plate 585 is disposed on the organic emitting element L1. The organic emitting element L1 is a light emitting unit for emitting light. The second polarizing plate 581 is disposed on the first polarizing plate 585. The plurality of phase shift plates 582, 583, and 584 are disposed between the first polarizing plate 585 and the second polarizing plate 581. The plurality of phase shift plates include a first phase shift plate 582 disposed between the first polarizing plate 585 and the second polarizing plate 581, a second phase shift plate 583 disposed between the first polarizing plate 585 and the first phase shift plate 582, and a third phase shift plate 584 disposed between the first polarizing plate 585 and the second phase shift plate 583. The third phase shift plate 584, the second phase shift plate 583, and the first phase shift plate 582 are sequentially stacked on the first polarizing plate 585.

The optical unit 58 further includes a phase shift plate 586 disposed between the first polarizing plate 585 and the organic light emitting element L1. Hereinafter, such additional phase shift plate is referred to as an additional phase shift plate 586. However, the first exemplary embodiment is not limited thereto. Accordingly, the additional phase shift plate 586 may be omitted.

The first polarizing plate 585 and the second polarizing plate 581 have different polarization axes, and linearly polarize light in a direction to the corresponding polarization axes. The first polarizing plate 585 and the second polarizing plate 581 pass light coinciding with a corresponding polarization axis and absorb light not coinciding with the corresponding polarization axis. After the light passes through the first polarizing plate 585 and the second polarizing plate 581, the light is linearly polarized to each polarization axis direction.

The second polarizing plate 581 has a higher polarization degree than that of the first polarizing plate 585, and has lower transmittance than that of the first polarization plate 585. The first polarizing plate 585 has higher transmittance than that of the second polarizing plate 581. The first polarizing plate 585 has a lower polarization degree than that of the second polarizing plate 581. Accordingly, when light passes through the first polarizing plate 585, the loss of light is less and the polarization degree is lower that light passed through the second polarizing plate 581.

The first polarizing plate 585 has a matrix structure. The first polarizing plate 585 has a matrix, and includes iodine and a dye. The matrix may have a structure of polyvinyl alcohol (PVA).

The first polarizing plate 585 includes iodine, a dye, and polyvinyl alcohol. The transmittance of the first polarizing plate 585 may be improved. The polarization degree of the first polarization plate 585 may be reduced at the same time by reducing the concentration of at least one of the iodine, dye, and polyvinyl alcohol.

When a polarizing plate is formed by including only iodine with polyvinyl alcohol, an iodine ion chain is oriented by being stretched and oriented with polyvinyl alcohol chain. Therefore, the polarizing plate has a polarization property. When the polyvinyl alcohol includes only iodine, the polarization efficiency and transmittance of the polarizing plate are improved. However, due to the sublimation property of the iodine, durability against temperature, humidity, and light is deteriorated. In other words, the uniformity of the polarizing plate may be deteriorated. When the polarizing plate is formed by including only the dye with the polyvinyl alcohol, similar to a polarizing plate formed with only iodine and polyvinyl alcohol, the dye is stretched and oriented with the polyvinyl alcohol chain, thereby polarizing at the polarizing plate. Since the dye does not have a sublimation property, the polarizing plate formed of dye and polyvinyl alcohol may have superior durability. However, the diachronic property may be deteriorated.

The first polarizing plate 585 formed of iodine, having superior uniformity, and dye, having superior durability with polyvinyl alcohol has improved uniformity. Uniformity is improved because the dye compensates insufficient uniformity of the iodine.

The first polarizing plate 585 has an absorption axis and a polarization axis. The absorption axis is a stretched and oriented axis of an iodine ion chain and a dye ion chain. The absorption axis absorbs one of two vertical components of light vibrated in a random direction, while electrons of the first polarizing plate 585 interact with one of the two vertical components, so that the electrical energy of light is changed to electronic energy. The polarization axis is an axis perpendicular to the absorption axis. The polarization axis passes the vibrating light in a direction to the polarization axis.

The first polarizing plate 585 may be formed by a method of stretching a polyvinyl alcohol film and cohering iodine and dye therewith, a method of absorbing iodine and dye in a polyvinyl alcohol film and stretching the polyvinyl alcohol film, and a method of dying iodine and dye at a polyvinyl alcohol film and stretching the polyvinyl alcohol film at the same time.

The weight ratio of iodine and dye of the first polarizing plate 585 may be about 1:1 to about 1:2. When the weight ratio of iodine and dye satisfies the above range, the uniformity and the polarization degree of the first polarizing plate 585 become superior, without deterioration. As a general range, the thickness of the first polarizing plate 585 may be about 15 µm to about 30 µm.

An intersection angle of the polarization axis of the first polarizing plate 585 and the polarization axis of the second polarizing plate 581 is about 45 degrees.

The first phase shift plate 582 is a ½ wavelength plate. The first phase shift plate 582 has an optical axis tilted at a predetermined angle in a range of about 17.5 degrees to about 27.5 degrees, compared to the polarization axis of the second polarizing plate 581. In other words, an intersection angle of the optical axis of the first phase shift plate 582 and the polarization axis of the second polarizing plate 581 is in a range of about 17.5 degrees to about 27.5 degrees. An intersection angle of an optical axis of the first phase shift plate 582 and a polarization axis of the first polarizing plate 585 is in a range of about 17.5 degrees to about 27.5 degrees.

The second phase shift plate 583 is a ¼ wavelength plate. The second phase shift plate 583 has an optical axis tilted at a predetermined angle in a range of about 40 degrees to about 50 degrees from the polarization axis of the second polarizing plate 581.

An intersection angle of an optical axis of the second phase shift plate 583 and the polarization axis of the second polarizing plate 581 is in a range of about 40 degrees to about 50 degrees. An intersection angle of an optical axis of the second phase shift plate 583 and the polarization axis of the first polarizing plate 585 is in a range of about 0 degrees to about 5 degrees.

The third phase shift plate 584 is a ¼ wavelength plate. The third phase shift plate 584 has an optical axis tilted at a predetermined angle in a range of about 85 degrees to about 95 degrees from the polarization axis of the second polarizing plate 581. The intersection angle of an optical axis of the third phase shift plate 584 and the polarization axis of the second polarizing plate 581 is in a range of about 85 degrees to about 95 degrees. The intersection angle of an optical axis of the third phase shift plate 584 and the polarization axis of the first polarizing plate 585 is in a range of about 40 degrees to about 50 degrees.

The additional phase shift plate 586 is a ¼ wavelength plate. The additional phase shift plate 586 has an optical axis tilted at a predetermined angle in a range about 40 degrees to about 50 degrees from the polarization axis of the first polarizing plate 585.

Where the organic light emitting element L1 and the driving circuit (DC) are formed, the second substrate 52 covers the first substrate 51. The second substrate 52 is arranged opposite to the first substrate 51 and covers the first substrate 51 to seal the thin film transistors T1 and T2, the capacitor C1, and the organic light emitting element L1 from the outside. Although not shown, the second substrate 52 is cohered to the first substrate 51 through a sealer formed along an edge. Thus, a space is sealed between the first and second substrates 51 and 52.

Although the optical unit 58 formed on the organic light emitting element L1 is attached on the second substrate 52, the present embodiments are not limited thereto. Accordingly, the optical unit 58 is disposed between the second substrate 52 and the organic light emitting element L1. The optical unit 58 may be covered by the second substrate 52. The optical unit 58 may be disposed inside a sealed space, between the first substrate 51 and the second substrate 52. The optical unit 58 may be disposed at any location along a light emitting path of the organic light emitting element L1. The organic light emitting element L1 is a light emitting unit.

The organic light emitting diode (OLED) display 100 minimizes the loss of light emitted from the organic emission layer 545 to the outside while effectively suppressing external reflection and improving visibility. The display characteristic of the organic light emitting diode (OLED) display 100 is improved.

The organic light emitting diode (OLED) display 100 has low power consumption and improved life-span because light generated from the organic emission layer 545 is efficiently emitted to the outside.

A fundamental concept of the optical unit 58 of the organic light emitting diode (OLED) display, according to the first exemplary embodiment, is that the optical unit 58 effectively suppresses external reflection and minimizes the loss of light emitted from the organic emission layer 545 to the outside. The fundamental concept of the optical unit 58 will be described with reference to FIG. 3 to FIG. 9.

Light passing through the optical unit 58 will be described based on visible light. Visible light has a color classified by a wavelength band. Blue light has a wavelength within a predetermined range of about 420 nm to about 480 nm. Green light has a wavelength of about 550 nm. Red light has a wavelength of about 650 nm.

Visible light passing through the optical unit 58 each have different wavelengths. Thus, there is a slight variation of each visible light color. Accordingly, in the optical unit 58, the plurality of phase shift plates 582, 583, and 584 are adjusted to have a proper angle within the described wavelength range. The proper angle is adjusted in relation to a color light, suppressing external light reflection, and the state of light emitted from the organic light emitting element L1.

An operation of the optical unit 58 will be described based on an optical unit 58 arranged to minimize the loss of blue light and externally emit the blue light from the organic light emitting element L1. Such an arrangement of the optical unit 58 is proper when luminance of blue light is lower than other light emitted from the organic light emitting element L1.

However, other visible light is not that different from blue light when other visible light passes through the optical unit 58. In other words, other visible light has similar behavior to blue light when other visible light passes through the optical unit 58. Other visible light has a slightly different behavior, because other visible light has different wavelengths than blue light. Other visible light has slightly lower transmittance than blue light when other visible light passes through the optical unit 58. All visible light, including blue light, has similar behavior in present embodiments.

A path of light flowing into the optical unit 58 from the outside will be described with reference to FIG. 3 to FIG. 5.

Figure 3:
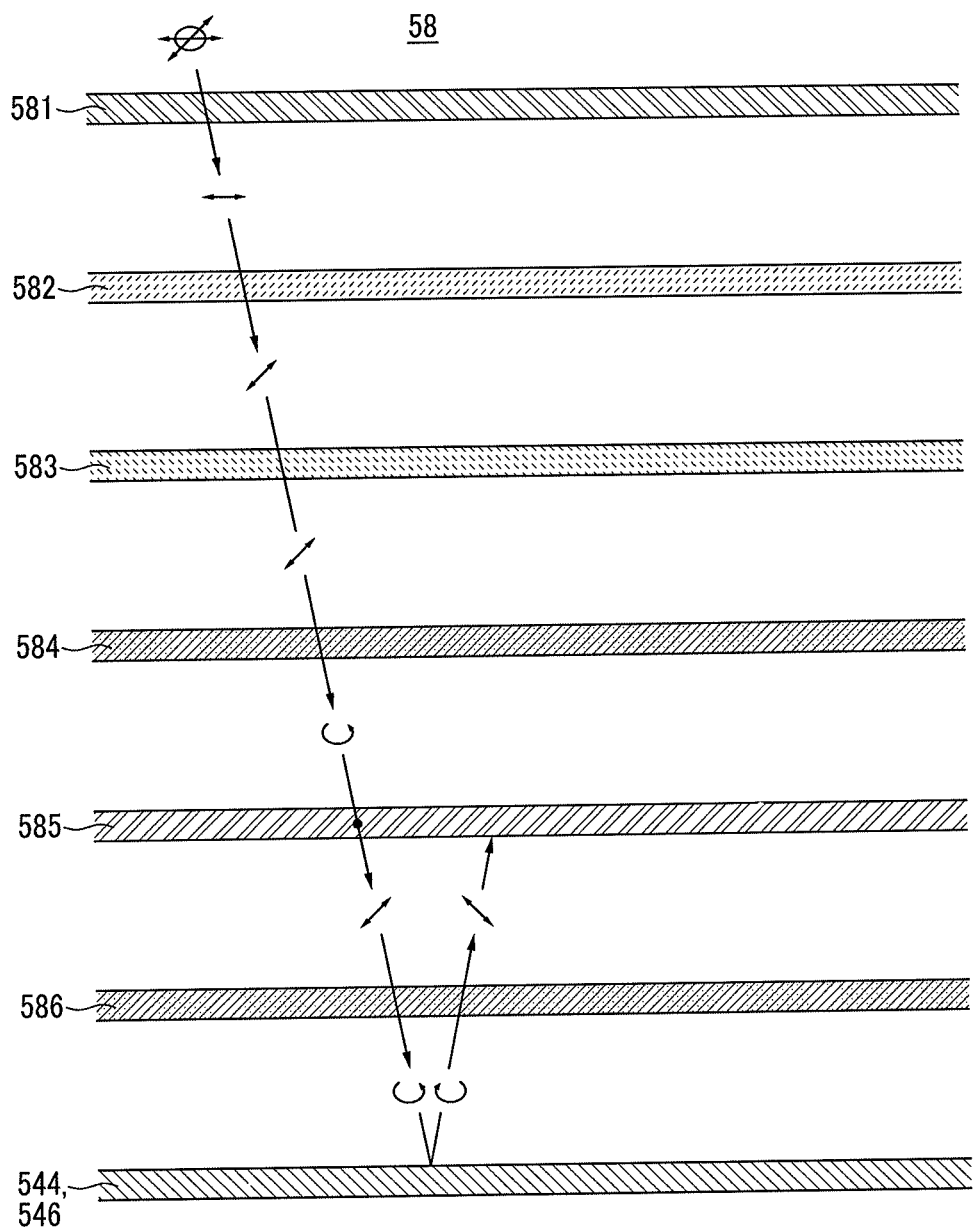
FIG. 3 is a cross-sectional view illustrating a path of light inflowing from the outside to an organic light emitting diode (OLED) display according to the first exemplary embodiment.
Figure 4:
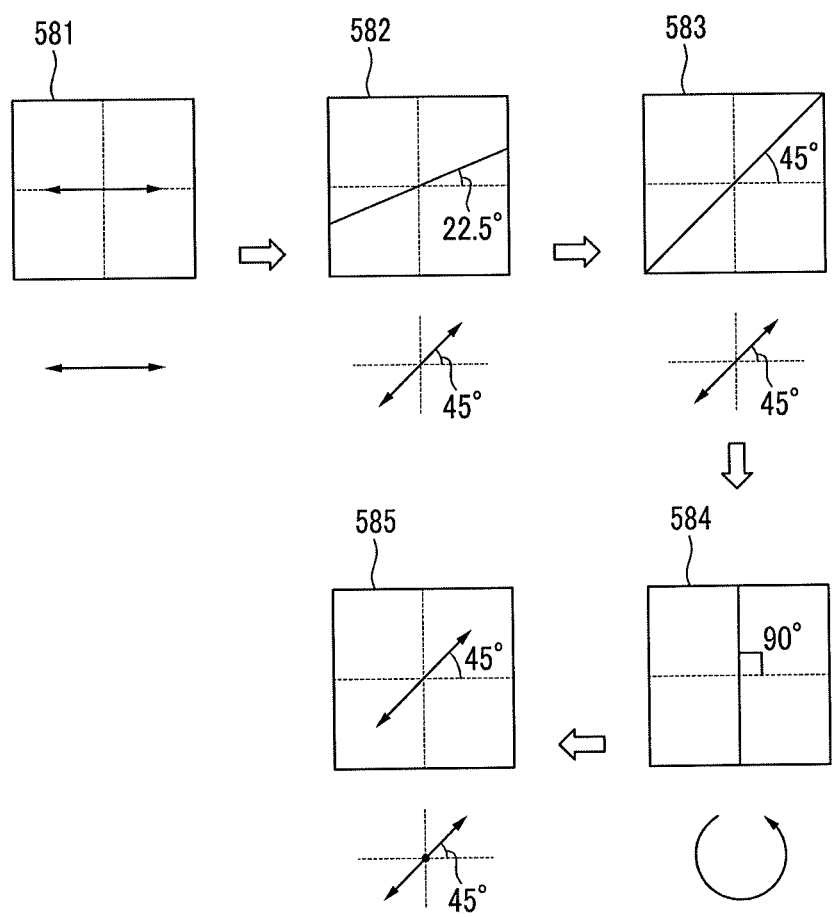
FIG. 4 is a schematic diagram illustrating a path of light inflowing from the outside to an organic light emitting diode (OLED) display according to the first exemplary embodiment.

FIG. 3 and FIG. 4 are a cross-sectional view and a schematic diagram illustrating a path of light flowing from the outside into an organic light emitting diode (OLED) display according to the first exemplary embodiment. FIG. 5 is a diagram illustrating the loss of light flowing from the outside into the organic light emitting diode (OLED) display according to the first exemplary embodiment.

Figure 5:
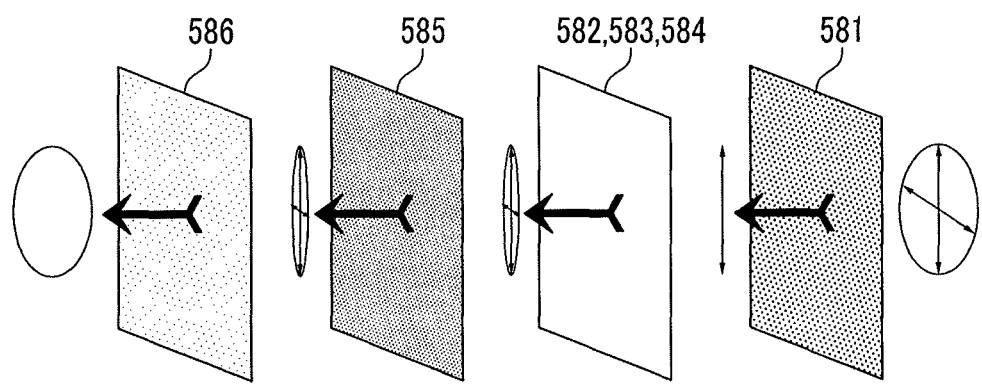
FIG. 5 is a diagram illustrating the loss of light inflowing from the outside to the organic light emitting diode (OLED) display according to the first exemplary embodiment.

While external light passes through the second polarization plate 581, as shown in FIG. 3 to FIG. 5, external light, having various phases, is linearly polarized in a direction to a polarization axis of the second polarizing plate 581. While the linearly polarized light passes through the first phase shift plate 582, which is a ½ wavelength plate, the linearly polarized light rotates 45 degrees with the linear polarization state sustained. The optical axis of the first phase shift plate 582 is tilted at about 22.5 degrees from the polarization axis of the second polarizing plate 581. The intersection angle of the optical axis of the first phase shift plate 582 and the polarization axis of the second polarizing plate 581 is about 22.5 degrees.

The 45 degree rotated and linearly-polarized light passes through the second phase shift plate 583, without any substantial variation. The second phase shift plate 583 is a ¼ wavelength plate. The optical axis of the second phase shift plate 583 is tilted at about 45 degrees from the polarization axis of the second polarizing plate 581. The intersection angle of the optical axis of the second phase shift plate 583 and the polarization axis of the second polarizing plate 581 is about 45 degrees.

Since the axis direction of the 45 degree rotated and linearly polarized light from the first phase shift plate 582 is substantially equivalent to an optical axis direction of the second phase shift plate 583, light passes the second phase shift plate 583 without any substantial variation. Since the visible light has various wavelengths distributed by each color, the term "substantially identical" means that axis directions of all light passing through the first phase shift plate 582 are not perfectly identical.

The 45 degree rotated and linearly-polarized light, passing through the second phase shift plate 583, is changed to circular polarized light after passing through the third phase shift plate 584. The third shift plate 584 is a ¼ wavelength plate. An optical axis of the third phase shift plate 584 is tilted at about 90 degrees from the polarization axis of the second polarizing plate 581. An intersection angle between an optical axis of the third phase shift plate 584 and a polarization axis of the second polarizing plate 581 is about 90 degrees.

Since the intersection angle between the axis direction of the 45 degree rotated linearly polarized light and an optical axis direction of the third phase shift plate 584 is about 45 degrees, the linearly-polarized light is changed to circular polarized light while passing through the third phase shift plate 584.

While passing through the first polarizing plate 585, the circular polarized light from the third phase shift plate 584 is linearly polarized in a polarization axis direction of the first polarizing plate 585. Light not linearly polarized is absorbed. Among the circular polarized light, some light having components matching the polarization axis of the first polarizing plate 585 passes through the first polarizing plate 585. The remaining light is absorbed at the first polarization plate 585 and eliminated. The remaining light is eliminated because the light is not matched with the polarization axis. A smaller amount of the external light is absorbed at the first polarization plate 585 and eliminated than the external light passing through the second polarizing plate 581. This occurs because the first polarizing plate 585 has a higher transmittance and a lower polarization degree that that of the second polarizing plate 581. In other words, the loss of light becomes smaller when the light passes through the first polarizing plate 585.

Since a predetermined part of the circular polarized light is eliminated when the circular polarized light passes through the first polarizing plate 585, the organic light emitting diode (OLED) display 100 can suppress external light reflection.

While passing through the additional phase shift plate 586, the linearly polarized light from the first polarizing plate 585 is circularly polarized. The circular polarized light is reflected at electrodes 544 and 546 of the organic light emitting element L1. The axis direction of the circular polarized light is changed by about 180 degrees. The light may be reflected not only by the electrodes 544 and 546 of the organic light emitting element L1, but also reflected by other metal wires.

While passing through the additional phase shift plate 586, absorbed at the first polarizing plate 585, and eliminated, the circular polarized light with the axis direction changed at 180 degrees is again linearly polarized.

The light remaining after passing through the first polarizing plate 585 passes through the additional phase shift plate 586 and is reflected by the organic light emitting element L1. The reflected light passes through the additional phase shift plate 586 again and is eliminated by the first polarization plate 585. Therefore, the organic light emitting diode (OLED) display 100 suppresses the external light reflection.

The light flowing from the outside into the inside, through the optical unit 58, is almost eliminated at the first polarizing plate 585. Accordingly, the organic light emitting diode (OLED) display 100 effectively suppresses the external light reflection and improves the visibility.

A path of light emitted to the outside from an organic emission layer (545 in FIG. 1) will be described with reference to FIG. 6 to FIG. 8.

Figure 6:
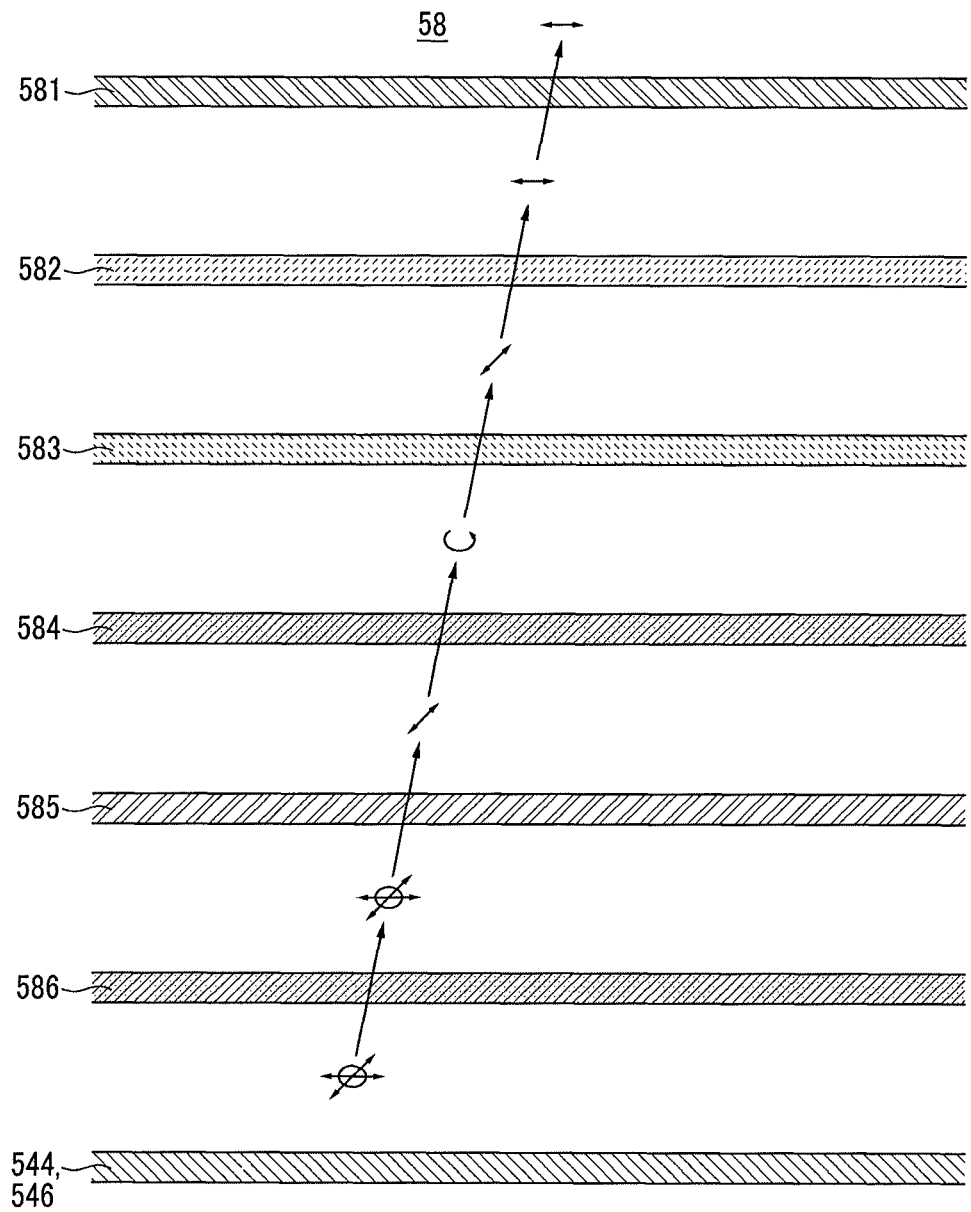
FIG. 6 is a cross-sectional view illustrating a path of light emitted from an organic light emitting element of the organic light emitting diode (OLED) display to the outside according to the first exemplary embodiment.
Figure 7:
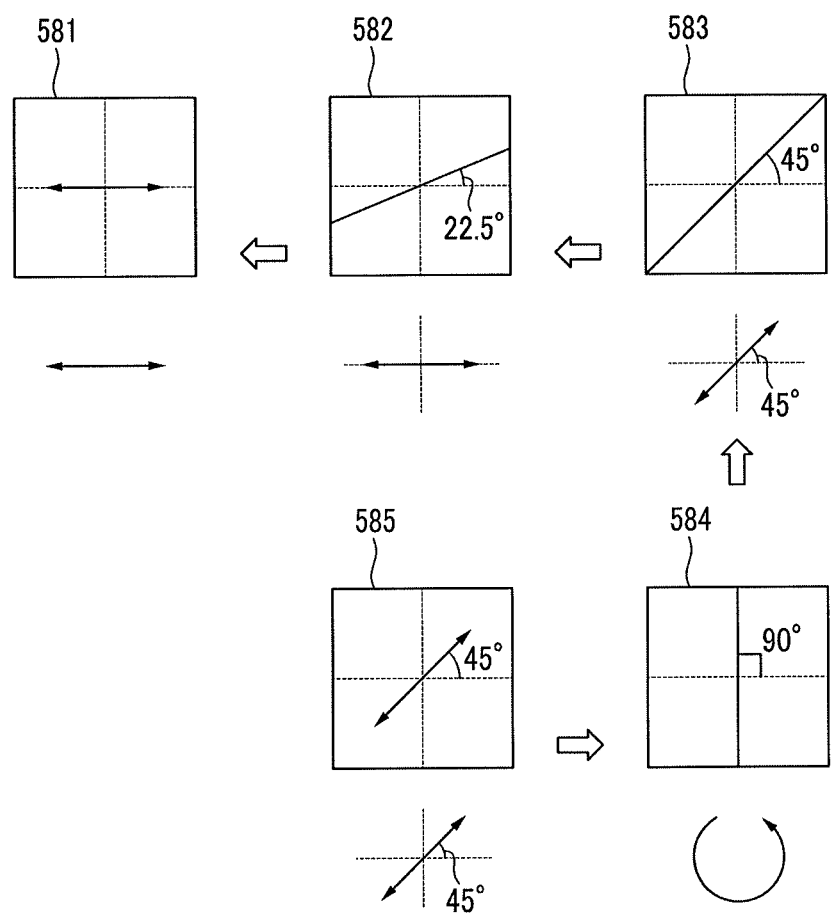
FIG. 7 is a schematic diagram illustrating a path of light emitted from an organic light emitting element of the organic light emitting diode (OLED) display to the outside according to the first exemplary embodiment.
Figure 8:
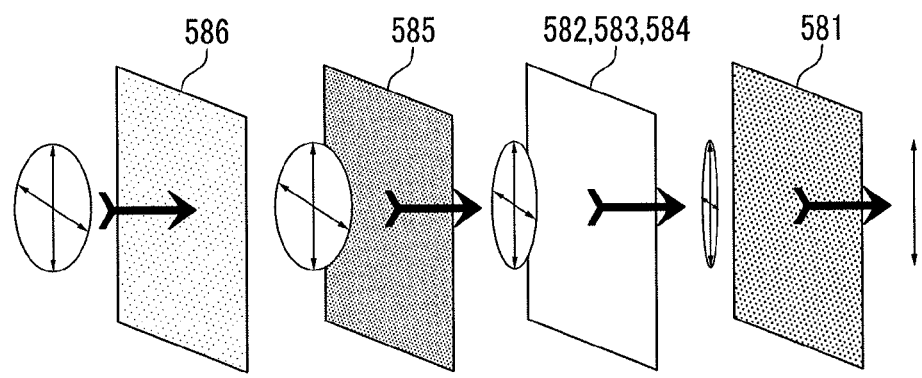
FIG. 8 is a diagram illustrating the loss of light emitted from an organic light emitting element of the organic light emitting diode (OLED) display to the outside according to the first exemplary embodiment.

FIG. 6 and FIG. 7 are a cross-sectional view and a schematic diagram illustrating a path of light emitted from an organic light emitting element of the organic light emitting diode (OLED) display to the outside according to the first exemplary embodiment. FIG. 8 is a diagram illustrating the loss of light emitted from an organic light emitting element of the organic light emitting diode (OLED) display to the outside according to the first exemplary embodiment.

The light emitted from the organic emission layer 545 sequentially passes through the second electrode 546 and the additional phase shift plate 586. The light has various phases.

After passing through the additional phase shift plate 586, the light propagates to the first polarizing plate 585. While passing through the first polarizing plate 585, light matching a polarization axis of the first polarizing plate 585, among the light passing through the additional phase shift plate 586, is linearly polarized. A smaller amount of the internal light is absorbed at the first polarizing plate 585 and eliminated than the internal light passing through the second polarizing plate 585. A smaller amount of the internal light is absorbed because the first polarizing plate 585 has a higher transmittance and a lower polarization degree than the second polarizing plate 581. The loss of light becomes smaller when the light passes through the first polarizing plate 585.

While passing through the third phase shift plate 584 which is a ¼ wavelength plate, the linearly-polarized light, after passing through the first polarizing plate 585, is circular polarized. The optical axis of the third phase shift plate 584 is tilted at about 45 degrees from a polarization axis of the first polarizing plate 585. The intersection angle between the optical axis of the third phase shift plate 584 and the polarization axis of the first polarizing plate 585 is about 45 degrees.

Since the intersection angle between the axis direction of the linearly polarized light, passed through the first polarizing plate 585, and an optical axis direction of the third phase shift plate 584 is about 40 degrees, the linearly polarized light becomes circular polarized while passing through the third phase shift plate 584.

While passing through the second phase shift plate 583, which is a ¼ wavelength plate, the circular polarized light, after passing through the third delay plate 584, is linearly polarized. An optical axis of the second phase shift plate 583 is identical to a polarization axis of the first polarizing plate 585. The circular polarized light, after passing through the third phase shift plate 584, is linearly polarized while passing through the second phase shift plate 583. The linearly polarized light, after passing through the second phase shift plate 584, becomes identical to the linearly polarized light, before passing through the third phase shift plate 584. The light that is linearly polarized by passing through the first polarizing plate 585 is similar to the light that is linearly polarized by passing through the second phase shift plate 583.

The linearly polarized light, after passing through the second phase shift plate 583, rotates about 45 degrees with the linear polarization state. The linear polarization state is sustained while passing through the first phase shift plate 582, which is a ½ wavelength plate. The optical axis of the first phase plate 582 is tilted at about 22.5 degrees from the polarization axis of the first polarizing plate 585. An intersection angle between the optical axis of the first phase shift plate 582 and the polarization axis of the first polarizing plate 585 is about 22.5 degrees.

The axis direction of the 45 degree rotated and linearly polarized light after passing through the first phase shift plate 582, is substantially equivalent to the polarization axis direction of the second polarizing plate 581. Accordingly, the 45 degree rotated and linearly polarized light is emitted to the outside after passing through the second polarizing plate 581 without substantial loss.

Such a structure discharges the light emitted from the organic light emitting element L1 to the outside without substantial loss. A related structure, having one polarizing plate and one phase shift plate arranged, discharges about 40% of light emitted from an organic light emitting element L1. It is confirmed, through experiments, that the organic light emitting diode (OLED) display 100 according to the first exemplary embodiment effectively, discharges about 60% to 80% of light emitted from the organic light emitting element L1 through the optical unit 58. Therefore, the optical unit 58 minimizes the loss of light emitted from the organic emission layer 545 and discharged to the outside.

Since the organic light emitting diode (OLED) display 100 efficiently discharges the light emitted from the organic emission layer 545 to the outside, power for driving the organic emission layer 545 is reduced. Thus, the lifespan of the organic light emitting diode (OLED) display 100 is improved.

Although the optical unit 58 is disposed on the organic light emitting unit L1 in the organic light emitting diode (OLED) display 100 according to the first exemplary embodiment, the optical unit 58 may be disposed on a light emitting unit, e.g., a liquid crystal display (LCD) or a plasma display panel (PDP), or disposed on a light emitting unit in another exemplary embodiment.

An organic light emitting diode (OLED) display 200, according to the second exemplary embodiment, will be described with reference to FIG. 9.

Figure 9:
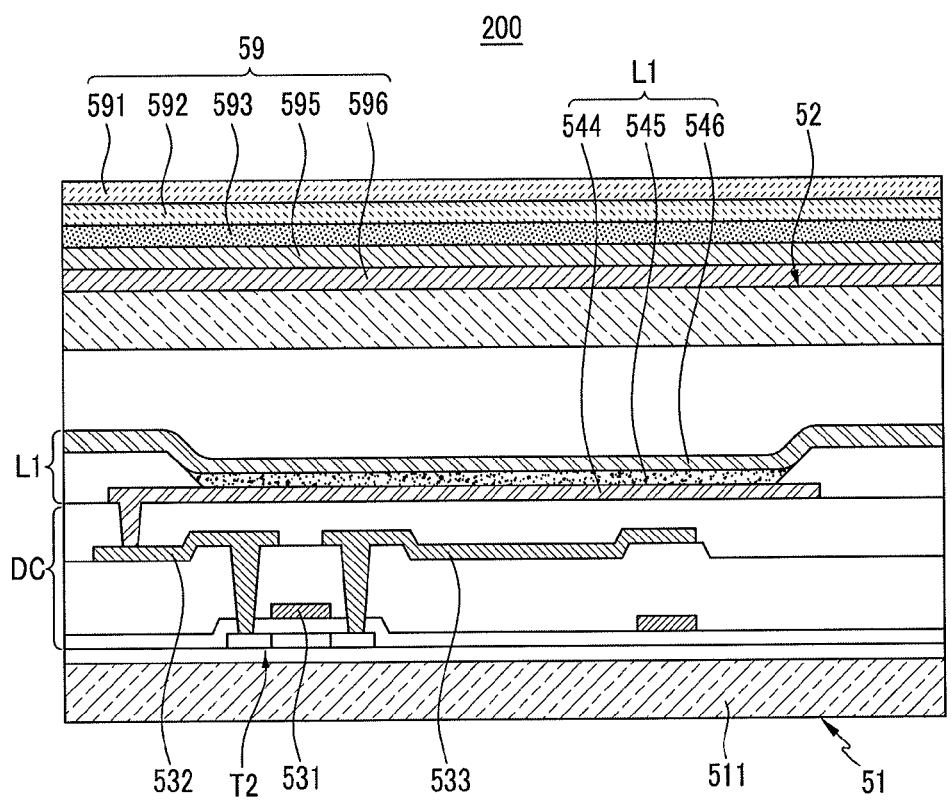
FIG. 9 is a cross-sectional view illustrating an organic light emitting diode (OLED) display according to the second exemplary embodiment.

FIG. 9 is a cross-sectional view illustrating an organic light emitting diode (OLED) display according to the second exemplary embodiment.

As shown in FIG. 9, the organic light emitting diode (OLED) display 200, according to the second exemplary embodiment, includes a first substrate 51, a second substrate 52 cohered with the first substrate 51, and an optical unit 59.

The optical unit 59 includes a first polarizing plate 595, a second polarizing plate 591, and a plurality of phase shift plates 592 and 593.

The first polarizing plate 595 is disposed on an organic light emitting element L1. The second polarizing plate 591 is disposed on the first polarizing plate 595. The plurality of phase shift plates 592 to 593 are disposed between the first polarizing plate 595 and the second polarizing plate 591. The plurality of phase shift plates includes a fourth phase shift plate 592, disposed between the first polarizing plate 595 and the second polarizing plate 591, and a fifth phase shift plate 593, disposed between the first polarizing plate 595 and the fourth phase shift plate 592. The fifth phase shift plate 593 and the fourth phase shift plate 592 are sequentially stacked on the first polarizing plate 595.

The optical unit 59 further includes an additional phase shift plate 596 disposed between the first polarizing plate 595 and the organic light emitting element L1. The additional phase shift plate is referred to as the sixth phase shift plate 596. However, the second exemplary embodiment is not limited thereto. Therefore, the sixth phase shift plate 596 may be omitted.

An intersection angle between the polarization axis of the first polarizing plate 595 and the polarization axis of the second polarizing plate 591 is about 45 degrees.

The fourth phase shift plate 592 is a ½ wavelength plate. The fourth phase shift plate 592 has an optical axis tilted at a predetermined angle in a range from about 10 degrees to about 20 degrees from the polarization axis of the second polarizing plate 591. The intersection angle between the optical axis of the fourth phase shift plate 592 and the polarization axis of the second polarizing plate 591 is in a range of about 10 degrees to about 20 degrees. The intersection angle between the optical axis of the fourth phase shift plate 592 and the polarization axis of the first polarizing plate 595 is in a range of about 25 degrees to about 35 degrees.

The fifth phase shift plate 593 is a ¼ wavelength plate. The fifth phase shift plate 593 has an optical axis tilted at a predetermined angle in a range of about 70 degrees to about 80 degrees from the polarization axis of the second polarizing plate 591. The intersection angle between the optical axis of the fifth phase shift plate 593 and the polarization axis of the second polarizing plate 591 is in a range of about 70 degrees to about 80 degrees. The intersection angle between the optical axis of the fifth phase shift plate 593 and the polarization axis of the first polarizing plate 595 is in a range of about 25 degrees to about 35 degrees.

The sixth phase shift plate 596 is a ¼ wavelength. The sixth phase shift plate 596 has an optical axis tilted at a predetermined angle in a range of about 40 degrees to about 50 degrees from the polarization axis of the reflective first polarizing plates 595.

The organic light emitting diode (OLED) display 200 effectively suppresses external light reflection. Therefore, the image visibility displayed by the organic light emitting element L1 is improved and, at the same time, the loss of light discharged to the outside from the organic emission layer 545 is minimized. The display characteristics of the organic light emitting diode (OLED) display 200 are improved.

The organic light emitting diode (OLED) display 200 efficiently discharges light emitted from the organic emission layer 545 to the outside. Accordingly, the power consumption is reduced, and the lifespan is improved.

A fundamental concept of an optical unit 59 of the organic light emitting diode (OLED) display, according to the second exemplary embodiment, that suppresses external light reflection and minimizes the loss of light discharged to the outside from the organic emission layer 545, will be described with reference to FIG. 10 to FIG. 13.

The operation of the optical unit will be described based on the optical unit 59. The optical unit 59 is arranged to minimize the loss of blue light and discharge the blue light emitted from the organic light emitting element L1 to the outside. This embodiment is similar to the first exemplary embodiment.

When other visible light passes through the optical unit 59, other visible light does not have much different behavior than blue light. While passing through the optical unit 59, other visible light has similar behavior to that of blue light. Other visible light does have slightly different behavior from blue light because other visible light has different wavelengths than blue light. As described in the first exemplary embodiment, when other visible light passes through the optical unit 59, unlike blue light, other visible light has decreasing transmittance.

A path of light flowing from the outside into the inside through an optical unit will be described with reference to FIG. 10 to FIG. 11.

Figure 10:
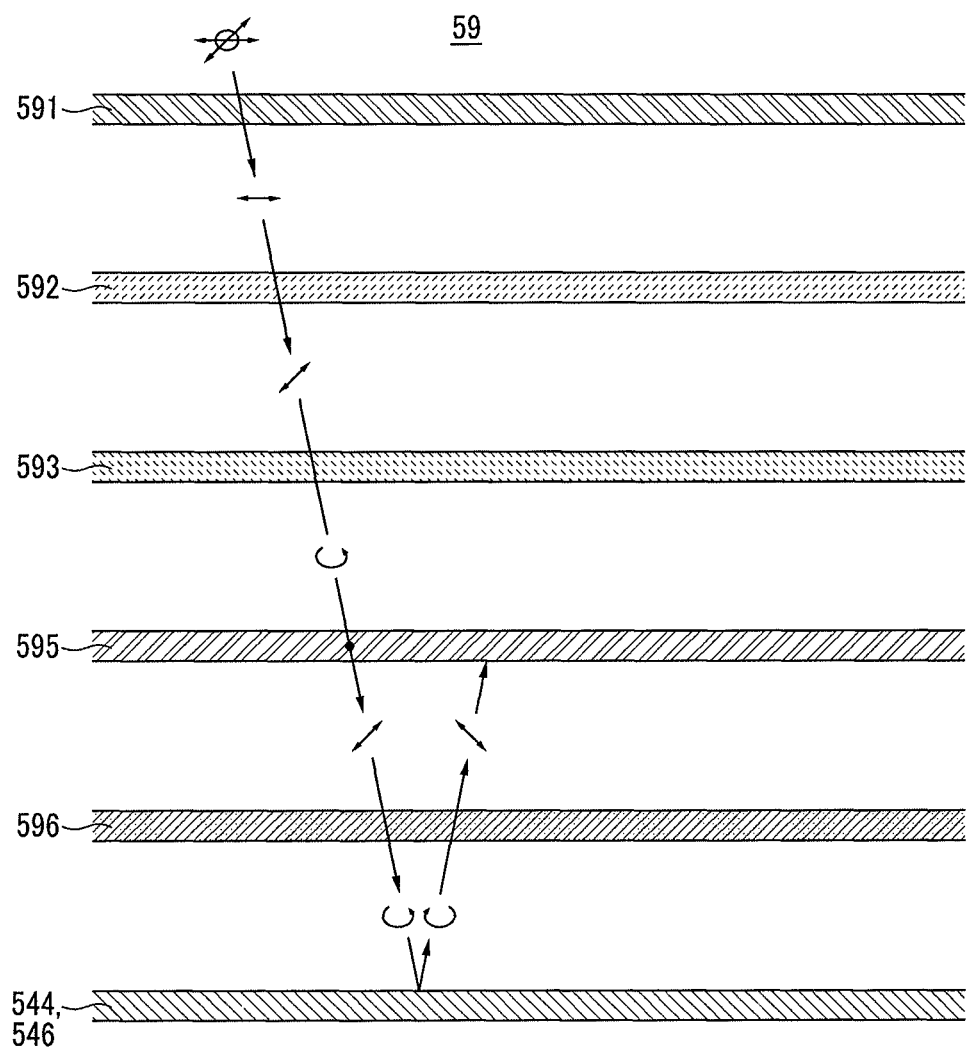
FIG. 10 is a cross-sectional view illustrating a path of light inflowing from the outside to the inside of the organic light emitting diode (OLED) display according to the second exemplary embodiment.
Figure 11:
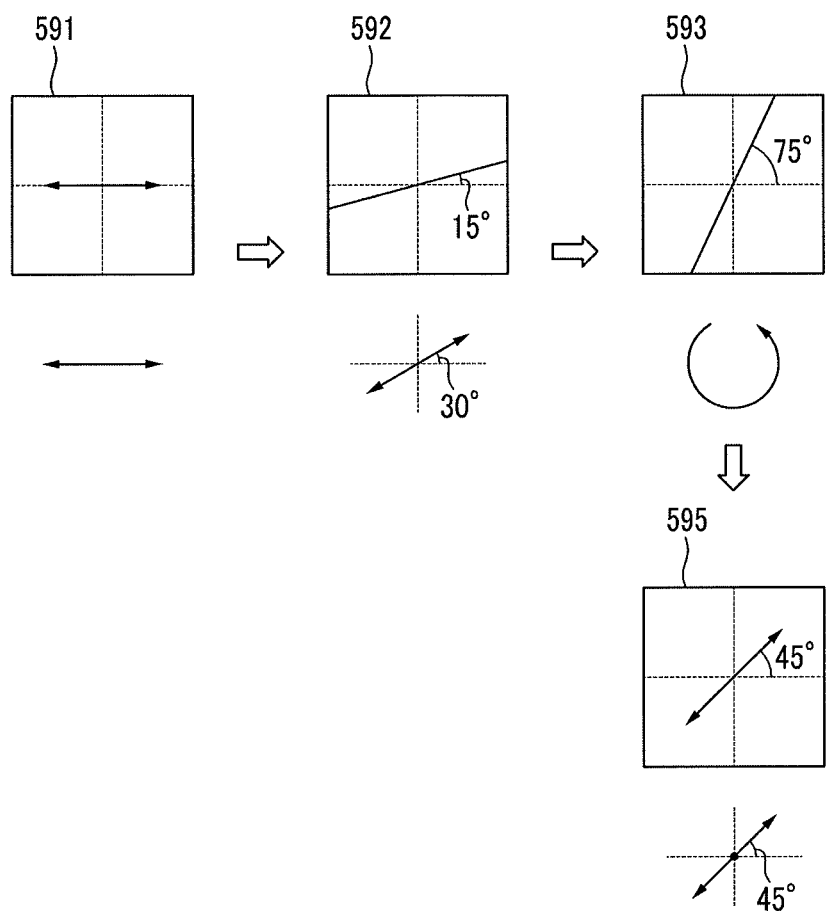
FIG. 11 is a schematic diagram illustrating a path of light inflowing from the outside to the inside of the organic light emitting diode (OLED) display according to the second exemplary embodiment.

FIG. 10 and FIG. 11 are a cross-sectional view and a schematic diagram illustrating a path of light flowing from the outside into the inside of the organic light emitting diode (OLED) display according to the second exemplary embodiment.

While passing through the second polarizing plate 591, as shown in FIG. 10 and FIG. 11, light having various phases is linearly polarized to a polarization axis direction of the second polarizing plate 591. While passing through the fourth phase shift plate 592, which is a ½ wavelength plate, the linearly polarized light rotates about 30 degrees. The optical axis of the fourth phase shift plate 592 is tilted at about 15 degrees from the polarization axis of the second polarizing plate 591. The intersection angle between the optical axis of the fourth phase shift plate 592 and the polarization axis of the second polarizing plate 591 is about 15 degrees.

The 30 degree rotated and linearly polarized light is circularly polarized while passing through the fifth phase shift plate 593, which is a ¼ wavelength plate. An optical axis of the fifth phase shift plate 593 is tilted at about 75 degrees from the polarization axis of the second polarizing plate 591. The intersection angle between the optical axis of the fifth phase shift plate 593 and the polarization axis of the second polarizing plate 591 is about 75 degrees.

Since an intersection angle between the axis direction of the 30 degree rotated and linearly polarized light and the optical axis direction of the fifth phase shift plate 593 is about 45 degrees, the light is circularly polarized, while passing through the fifth phase shift plate 593.

While passing through the first polarizing plate 595, the circularly polarized light, after passing through the fifth phase shift plate 593, is linearly polarized to the polarization direction of the first polarizing plate 595. Non-polarized light is absorbed at the first polarizing plate 595. Among the circularly polarized light, some light having components matching the polarization axis of the first polarizing plate 595 passes through the first polarizing plate 595. The remaining light is absorbed and eliminated at the first polarizing plate 595 because the remaining light does not match the polarization. A smaller amount of external light is absorbed and eliminated at the first polarizing plate 595, compared to the external light passing through the second polarizing plate 591, because the first polarizing plate 595 has higher transmittance and a lower polarization degree than the second polarizing plate 591. The loss of light becomes smaller when the light passes through the first polarizing plate 595.

Since the circularly polarized light is eliminated, while passing through the first polarizing plate 595, the organic light emitting diode (OLED) display 200 can suppress the external light reflection.

While passing through the sixth phase shift plate 596, the linearly polarized light, after passing through the first polarizing plate 595, is circularly polarized again and reflected at electrodes 544 and 546 of the organic light emitting element L1. The axis direction of the circularly polarized light is changed by about 180 degrees. The light may be reflected, not only by the electrodes 544 and 546 of the organic light emitting element L1, but also by various metal wires.

While passing through the sixth phase shift plate 596, the circularly polarized light, with the axis direction changed by 180 degrees is linearly polarized again. The linearly polarized light is absorbed and eliminated at the first polarizing plate 595.

The remaining light, passing through the first polarizing plate 595, passes through the sixth phase shift plate 596, is reflected by the organic light emitting element L1, passes through the sixth phase shift plate 596 again, and is eliminated at the first polarizing plate 595. Accordingly, the organic light emitting diode (OLED) display 200 suppresses external light reflection and improves the visibility thereof.

A path of light emitted from an organic emission layer (545, FIG. 9) to the outside will be described with reference to FIG. 12 and FIG. 13.

Figure 12:
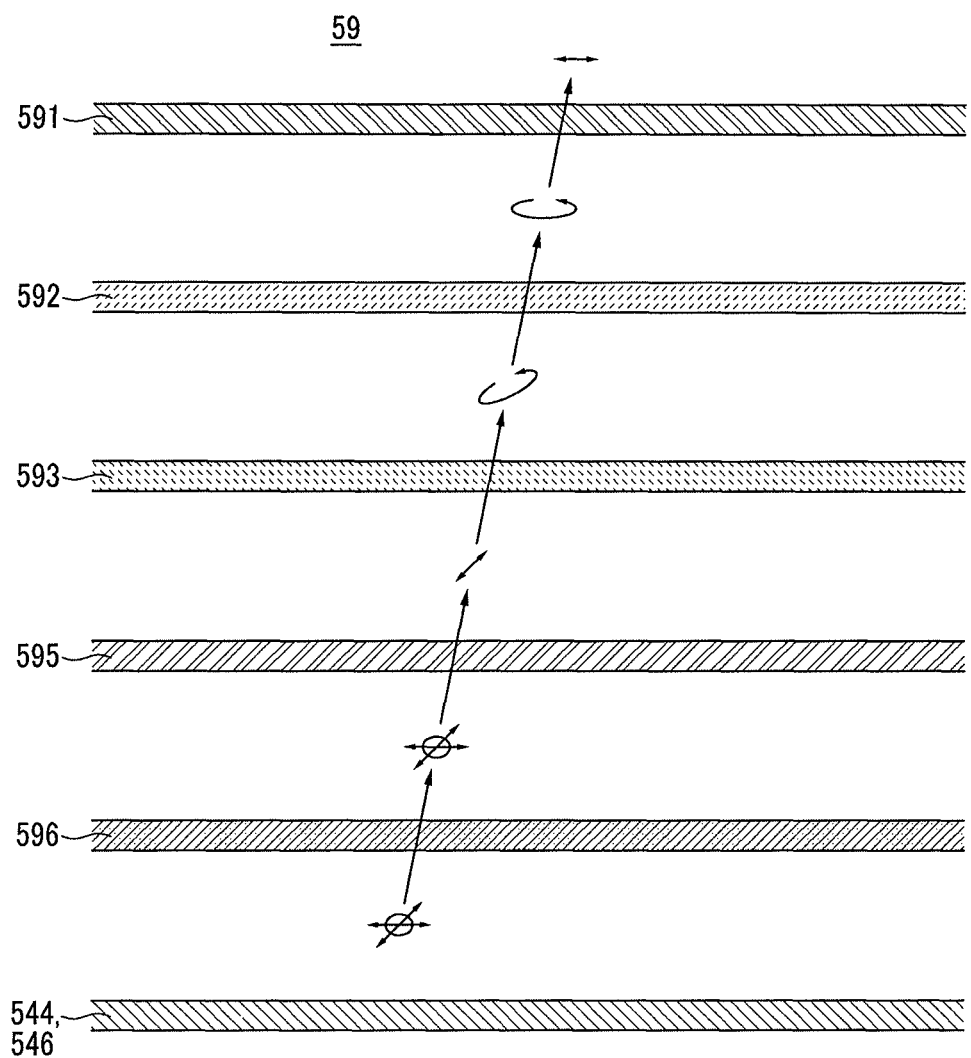
FIG. 12 is a cross-sectional view illustrating a path of light emitted from the organic light emitting element of the organic light emitting diode (OLED) according to the second exemplary embodiment.
Figure 13:
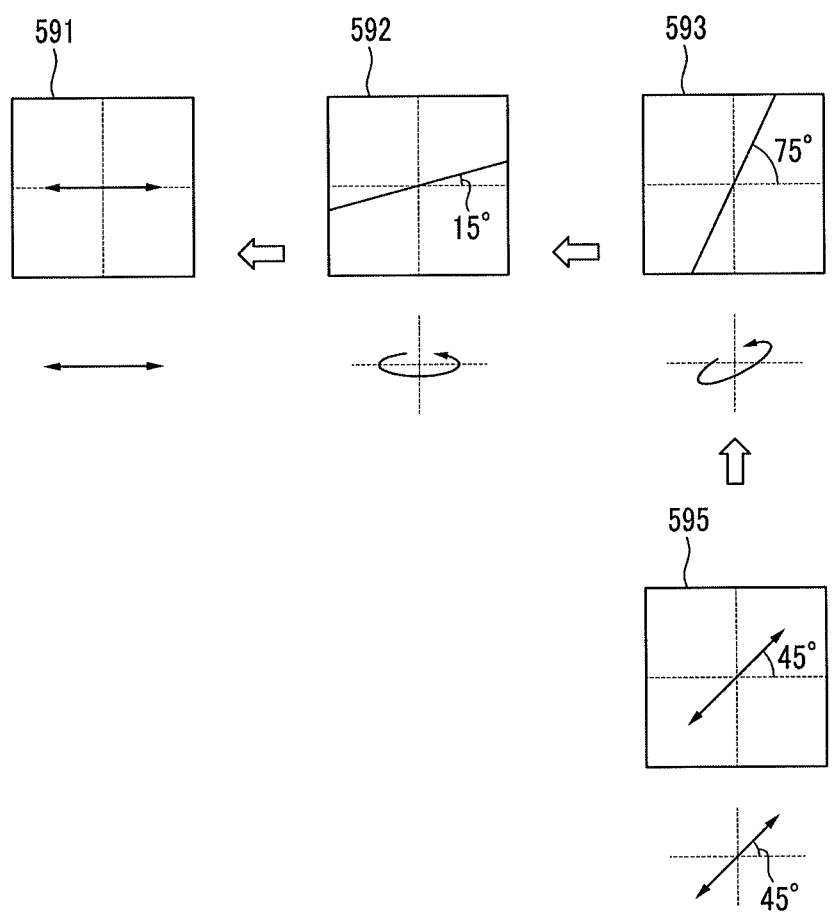
FIG. 13 is a schematic diagram illustrating a path of light emitted from the organic light emitting element of the organic light emitting diode (OLED) according to the second exemplary embodiment.

FIG. 12 and FIG. 13 are a cross-sectional view and a schematic diagram illustrating a path of light emitted from the organic light emitting element of the organic light emitting diode (OLED) according to the second exemplary embodiment.

As shown in FIG. 12 and FIG. 13, the light emitted from the organic emission layer 545 sequentially passes through the second electrode 546 and the sixth phase shift plate 596. The light has various phases.

The light, having passed through the sixth phase shift plate 596, propagates to the first polarizing plate 595. While passing through the reflective first polarizing plate 595, among light having passed through the sixth phase shift plate 596, light matched with the polarization axis of the first polarizing plate 595 is linearly polarized. A smaller amount of the internal light is eliminated at the first polarizing plate 595, compared to the internal light passing through the second polarizing plate 591, because the first polarizing plate 595 has higher transmittance and a lower polarization degree that the second polarizing plate 591. The loss of light becomes smaller when the light passes through the first polarizing plate 595.

While passing through the fifth phase shift plate 593 which is a ¼ wavelength plate, the linearly polarized light, after passing through the first polarizing plate 595, is circularly polarized. An optical axis of the fifth phase shift plate 593 is tilted at about 30 degrees from the polarization axis of the first polarizing plate 595. The intersection angle of the optical axis, of the fifth phase shift plate 593, and the polarization axis of the first polarizing plate 595 is about 30 degrees.

While passing through the fifth phase shift plate 593, since the intersection angle between the axis direction of the linearly polarized light, having passed through the first polarizing plate 595, and the optical axis direction of the fifth phase shift plate 593 is about 30 degrees, the light is circularly polarized. The light becomes circularly polarized when the intersection angle between the axis direction of the linearly polarized light and the optical axis of the fifth phase shift plate is about 45 degrees. However, the light becomes elliptically polarized light when the intersection angle is about 30 degrees.

While passing through the fourth phase shift plate 592, which is a ½ wavelength plate, the circular polarized light, after passing through the fifth phase shift plate 593, rotates about 15 degrees with the circularly polarized state sustained. The optical axis of the fourth phase shift plate 592 is tilted around 30 degrees from the polarization axis of the first polarizing plate 595. An intersection angle between the optical axis of the fourth phase shift plate 592 and the polarization axis of the first polarizing plate 595 is about 30 degrees.

The longitudinal axis direction of the 15 degree rotated and elliptically polarized light, after passing through the fourth phase shift plate 592, is similar to the polarization axis direction of the second polarizing plate 591. Even though the rotated and elliptically polarized light is not linearly polarized light, the significant amount of the 15 degree rotated and elliptically polarized light passes through the second polarizing plate 591 to the outside.

The light emitted from the organic light emitting element L1 is effectively discharged to the outside through the optical unit 59. Accordingly, the loss of the light discharged from the organic emission layer 545 to the outside can be minimized.

The organic light emitting diode (OLED) display 200 can efficiently discharge light emitted from the organic emission layer 545 to the outside. Accordingly, the driving power of the organic emission layer 545 is reduced. The lifespan of the organic light emitting diode (OLED) display 200 is improved.

The optical unit 59 of the organic light emitting diode (OLED) display 200 according to the second exemplary embodiment, has fewer phase shift plates 592 and 593 compared to the organic light emitting diode (OLED) display 100 according to the first exemplary embodiment. Accordingly, an organic light emitting diode (OLED) display 200 requires less manufacturing cost and a shorter manufacturing time.

A conventional organic light emitting diode (OLED) display includes organic light emitting diodes. Organic light emitting diodes display images by emitting light. However, electrodes forming an organic light emitting diode reflect external light. The display quality of an organic light emitting diode display may be deteriorated due to reflected external light.

A polarizing plate and a phase shift plate of the conventional art have been disposed on an organic light emitting diode to suppress external light reflection. When light emitted from the organic emission layer is emitted through a polarizing plate and a phase shift plate, a method for suppressing external light reflection has a significant loss of light emitting from an organic emission layer.

Present embodiments may be made in an effort to provide an optical unit and an organic light emitting diode (OLED) display, having the advantages of suppressing reflection of external light and, at the same time, minimizing the loss of light emitted from an organic light emitting element.

Exemplary embodiments of the inventive concept have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. An optical unit on a light emitting unit, comprising:
a first polarizing plate on the light emitting unit;
a second polarizing plate on the first polarizing plate, the second polarizing plate having a higher polarization degree and a lower transmittance than the first polarizing plate, an intersection angle between a polarization axis of the first polarizing plate and a polarization axis of the second polarizing plate being about 45 degrees; and
a plurality of phase shift plates between the first polarizing plate and the second polarizing plate, the plurality of phase shift plates including:
a first phase shift plate between the first polarizing plate and the second polarizing plate, wherein the first phase shift plate is a ½ wavelength plate;
a second phase shift plate between the first polarizing plate and the first phase shift plate, wherein the second phase shift plate is a ¼ wavelength plate; and
a third phase shift plate between the first polarizing plate and the second phase shift plate, wherein the third phase shift plate is a ¼ wavelength plate.

2. The optical unit as claimed in claim 1, wherein:
the first polarizing plate has a higher transmittance than the second polarizing plate.

3. The optical unit as claimed in claim 2, the first polarizing plate comprising:
a matrix;
an iodine; and
a dye.

4. The optical unit as claimed in claim 3, wherein:
a weight ratio of the iodine and the dye is in a range of about 1:1 to about 1:2.

5. The optical unit as claimed in claim 1, wherein:
an intersection angle between a polarization axis of the second polarizing plate and an optical axis of the first phase shift plate is in a range of about 17.5 degrees to about 27.5 degrees, and
an intersection angle between a polarization axis of the first polarizing plate and an optical axis of the first phase shift plate is in a range of about 17.5 degrees and to about 27.5 degrees.

6. The optical unit as claimed in claim 5, wherein:
an intersection angle between a polarization axis of the second polarizing plate and an optical axis of the second phase shift plate is in a range of about 40 degrees to about 50 degrees, and
an intersection angle between a polarization axis of the first polarizing plate and an optical axis of the second phase shift plate is in a range of about 0 degrees to about 5 degrees.

7. The optical unit as claimed in claim 6, wherein:
an intersection angle between a polarization axis of the second polarizing plate and an optical axis of the third phase shift plate is in a range of about 85 degrees to about 90 degrees, and
an intersection angle between a polarization axis of the first polarizing plate and an optical axis of the third phase shift plate is in a range of about 40 degrees to about 50 degrees.

8. The optical unit as claimed in claim 7, wherein:
an intersection angle between an optical axis of the second phase shift plate and an optical axis of the third phase shift plate is about 45 degrees.

9. The optical unit as claimed in claim 1, further comprising:
a fourth phase shift plate between the light emitting unit and the first polarizing plate.

10. The optical unit as claimed in claim 9, wherein:
an intersection angle between an optical axis of the fourth phase shift plate and a polarization axis of the first polarizing plate is in a range of about 40 degrees to about 50 degrees.

11. An organic light emitting diode (OLED) display, comprising:
an organic light emitting element for emitting light, wherein the organic light emitting element includes a first electrode, a second electrode on the first electrode, and an organic emission layer between the first electrode and the second electrode; and
the optical unit of claim 1 on the organic light emitting element.

* * * * *